United States Patent

Gong et al.

[11] Patent Number: 6,057,793
[45] Date of Patent: May 2, 2000

[54] DIGITAL DECIMATION FILTER AND METHOD FOR ACHIEVING FRACTIONAL DATA RATE REDUCTION WITH MINIMAL HARDWARE OR SOFTWARE OVERHEAD

[75] Inventors: Xue-Mei Gong; Tim J. Dupuis; Jinghui Lu; Korhan Titizer, all of Austin, Tex.

[73] Assignee: Oak Technology, Inc., Sunnyvale, Calif.

[21] Appl. No.: 09/097,141

[22] Filed: Jun. 12, 1998

[51] Int. Cl.[7] .................................................. H03M 3/00
[52] U.S. Cl. ........................................................... 341/143
[58] Field of Search .................................. 341/143, 155, 341/144

[56] References Cited

U.S. PATENT DOCUMENTS

| | | |
|---|---|---|
| 4,851,841 | 7/1989 | Sooch . |
| 5,079,734 | 1/1992 | Riley . |
| 5,220,327 | 6/1993 | Abbiate .................................. 341/143 |
| 5,455,782 | 10/1995 | Young et al. . |
| 5,646,621 | 7/1997 | Cabler et al. ........................... 341/143 |
| 5,654,711 | 8/1997 | Fujimori . |

OTHER PUBLICATIONS

Chu et al., "Multirate Filter Designs Using Comb Filters," *IEEE Transactions on Circuits and Systems*, vol. CAS–31, No. 11, Nov. 1984, pp. 405–416.

Franca et al., *Design of Analog–Digital VLSI Circuits for Telecommunications and Signal Processing*, Second Edition, Prentice Hall 1994, pp. 251–288.

*Primary Examiner*—Brian Young
*Attorney, Agent, or Firm*—Kevin L. Daffer; Conley, Rose & Tayon

[57] ABSTRACT

An analog-to-digital converter is provided for producing digital signal representative of analog signals. Noise induced upon the digital signals can be substantially removed using a digital decimation filter. The decimation filter includes a front-end portion which receives the digital data at a relatively high sample rate and performs filtering operations with minimal complexity. Preferably, the front-end portion includes at least one stage of filtering and more preferably at least two filter stages, each of which perform interpolation separate from decimation. According to one embodiment, the first stage of the front-end portion involves decimation and the latter stage or stages of that portion involves a combination of interpolation and decimation. The cumulative effect is to reduce the sample rate of the incoming data stream produced by, for example, a quantizer to a value which can be more easily manipulated by the back-end portion of the digital decimation filter. The front-end portion can therefore reduce the data rate change factor K to a smaller, fixed integer data rate change factor $K_1$, regardless of whether data rate change factor K is an integer number or involves a fractional number.

18 Claims, 4 Drawing Sheets

DIGITAL DECIMATION FILTER AND METHOD FOR ACHIEVING FRACTIONAL DATA RATE REDUCTION WITH MINIMAL HARDWARE OR SOFTWARE OVERHEAD

BACKGROUND OF THE INVENTION

1. Field of the Invention

This invention relates to a system for performing analog-to-digital ("A/D") conversion and, more particularly to a digital decimation filter which, in part, removes quantization noise produced by a modulator of the A/D converter. The decimation filter includes multiple filter stages, and performs switchable fractional and integer sample data rate reduction of the incoming one bit digital signal while minimizing the complexity of filter stages and the speed by which those filter stages operate.

2. Description of the Related Art

A popular A/D converter includes the oversampled converters or delta-sigma converters. A delta-sigma (or sigma-delta) converter is inherently an oversampling converter, although oversampling is just one of the techniques contributing to its overall performance. Essentially, a delta-sigma converter digitizes an analog signal at a very high sampling rate (i.e., oversampling) to perform a noise-shaping function, and to move the quantization noise to a higher frequency outside the frequency band of interest. The high frequency quantization noise can later be removed by a digital low pass filter. Decimation can thereafter be used to reduce the effective sampling rate back to the "Nyquist" rate.

Figure 1:
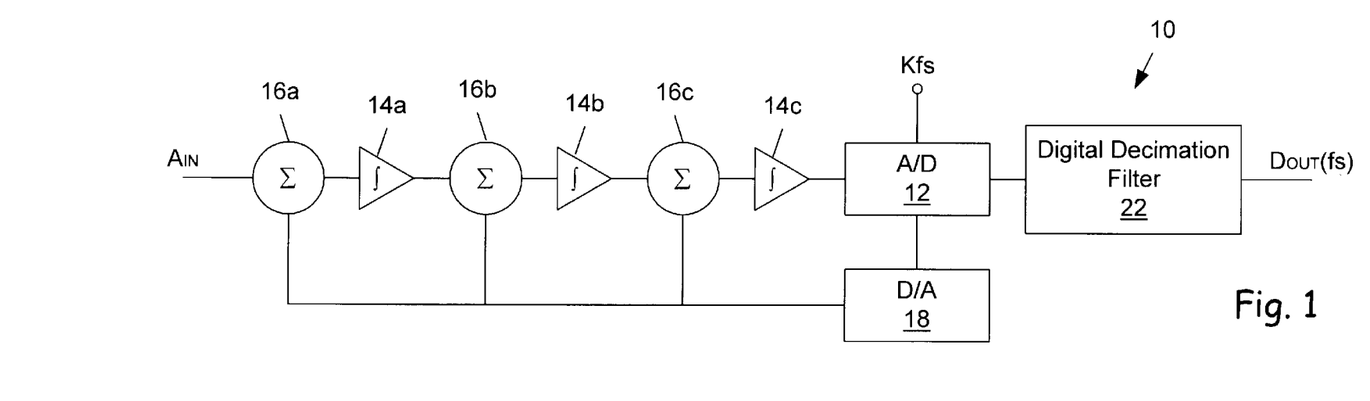
FIG. 1 is a block diagram of an oversampled A/D converter employing a delta-sigma modulator and a digital decimation filter.

FIG. 1 illustrates an exemplary third order delta-sigma converter 10. Converter is denoted a third order converter in that the output of A/D quantizer 12 is converted back to analog and then is fed into three sum nodes 16a, 16b and 16c. Integrators 14a, 14b and 14c and coupled as shown subsequent to respective sum nodes 16a, 16b and 16c. The integrators 14 integrate respective outputs of sum nodes 16a and 16b to produce the third order integration function.

The modulator which includes the various integrators 14 performs noise shaping to move its own quantization noise out of the frequency band of interest. The digital low pass filter which follows the modulator serves to eliminate the out-of-band noise without degrading the in-band signal. The modulator performs a sampling function of K times for each cycle of the analog signal $A_{IN}$. The output of quantizer 12 is therefore a digital bit stream of 1s and 0s.

A digital-to-analog ("D/A") converter 18 is used to select between a pair of reference voltages depending on whether a 1 or 0 is produced from quantizer 12. Operation of various components within a single or multiple-order delta-sigma modulator is illustrated in reference to U.S. Pat. No. 4,851,841, herein incorporated by reference.

Many modern delta-sigma modulators attempt to minimize overload produced from the modulator by utilizing what is often called a "cascaded" arrangement. A cascaded delta-sigma modulator is defined as one having more than one stage of single- or multiple-order integrators coupled together. An example of a multiple-order stage coupled in cascade with subsequent single or multiple-order stages is illustrated in reference to U.S. Pat. No. 5,654,711, herein incorporated by reference.

Figure 2:
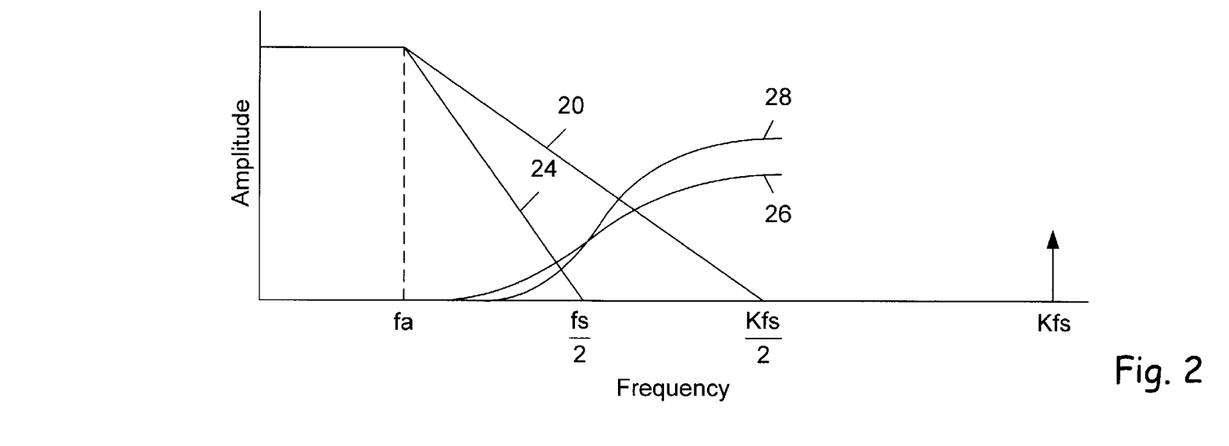
FIG. 2 is a graph of amplitude versus frequency of the analog filter within the delta-sigma modulator and the discrete time transfer function of the decimation filter, and further indicates characteristics of a first order modulator relative to a second order modulator.

Referring to FIGS. 1 and 2 in combination, noise induced by quantizer 12 generally exist at a frequency above the passband fa and upwards to an oversampling ratio K times the Nyquist sampling frequency fs. The integrators 14 produces an out-of-band tail between, e.g., fs/2 and Kfs/2.

The digital decimation filter 22 serves to remove the out-of-band tail, quantization noise between fs/2 and Kfs/2, as shown by reference numeral 24. Integrator 14 serves as a high-pass filter to quantization noise and can therefore be viewed as a noise shaping filter.

Utilizing two integrators rather than one improves the signal-to-noise ratio as a function of the oversampling ratio. FIG. 2 indicates that a first order transfer function has a slope 26 of about 6 dB per octave less than slope 28 of a second order transfer function. A careful increase in the number of orders, or cascading multiple orders, helps minimize the amount of noise which falls within a frequency band between zero and fa.

Digital decimation filter 22 must not only filter out the higher frequency noise produced by the noise-shaping process of the delta-sigma modulator, but also must act as an anti-aliasing filter with respect to the final sampling rate fs. Reducing the oversampled data rate to a final sampling rate fs involves digitally sub-sampling the filtered output of the delta-sigma modulator using a process called "decimation". Decimation is generally a well known concept, and can be viewed as a method by which redundant signal information introduced by, e.g., the oversampling process is removed.

In delta-sigma A/D converters, it is quite common to combine the decimation function with the digital filtering transfer function. This results in an increase in computational efficiency if done correctly. There are numerous digital filters which can be implemented with decimation. A popular filter includes the finite impulse response ("FIR") filter, often denoted as a moving weighted average filter. An advantage of FIR filters is that filter outputs need only be computed at the lower decimation rate, thereby achieving considerable efficiency in the computational process. Another filter denoted as the infinite impulse response ("IIR") filter is used if it is acceptable to compute an output for every sampled input. Depending on the amount of complexity needed, FIR and IIR filters can be implemented in multiple stages to achieve an overall digital decimation filter. A general discussion of FIR and IIR filters and/or the use of those filters in multiple stages implemented with multi-rates is set forth in, for example, U.S. Pat. Nos. 5,079,734 and 5,455,782, and further in an article to Franca et al, entitled "Design of Analog-Digital VLSI Circuits for Telecommunications and Signal Processing", (Prentice Hall, $2^{nd}$ Ed., 1994) pp. 251–288 (herein incorporated by reference).

The disadvantage associated with conventional FIR and IIR filters is that they generally require a coefficient multiplier at each of the plurality of taps associated with those structures. Each tap of the FIR and IIR structure requires a somewhat complex multiplier function, and each multiplier may have its own unique weighting factor. Achieving a distinct multiplier ratio for specific taps can require a fairly complex set of multiplier operations. It is therefore desirable that if a digital decimation filter includes FIR and IIR multiplier operations, those operations should be performed only when the data rates are relatively low.

If a portion of the digital decimation filter which receives the faster, oversampled data (i.e., "front-end portion") can somehow be reduced in complexity from that of a back-end portion, post-decimation, the overall decimation filter structure can be improved. Not only should the desired front-end portion avoid FIR and IIR structures, but must do so in multiple stages while expeditiously changing (interpolating and decimating) sampling rates in the interim between those stages to minimize complexity of both the front-end portion and the back-end portion.

In addition to implementing a digital decimation filter as multiple stages of decimation and interpolation, it of a non-conventional, desired benefit to carefully arrange the interpolation and decimation filters within the front-end portion so that the overall digital decimation filter can achieve either an integer sample rate conversion or a fractional sample rate conversion. Conventional digital decimation filters are limited, however, to integer sample rate reduction from Kfs to fs. It would be desirable to introduce a decimation filter which has a front-end portion dedicated to programmable, fractional decimation in order for the decimation filter to accommodate incoming sample rates which cannot be decimated to fs by whole integer numbers. Accordingly, it would be of benefit to implement at least a portion of a decimation filter which can decimate the incoming sampling rate by either integer or fractional amounts and can do so without requiring filter stages which employ coefficient multipliers or other complex scaling operations normally attributed, e.g., to FIR and IIR transfer functions.

SUMMARY OF THE INVENTION

Broadly speaking, an A/D converter is presented which includes a digital decimation filter. The decimation filter includes multiple stages, each of which may implement a unique sample rate. Multiple stages of the digital decimation filter front-end portion is dedicated to receiving oversampled digital data dispatched from a delta-sigma modulator, for example. Those front-end stages are implemented either as a comb (i.e., sinc) transfer function or a cosine transfer function.

The comb and/or cosine filters of the front-end stages perform decimation, followed by interpolation, and again followed by decimation. A programmable sample rate conversion can be achieved by the cumulative effect of the decimation, interpolation and decimation rate changes to either achieve an overall integer number sample rate reduction or an integer sample rate reduction combined with a fractional sample rate reduction. In the latter instance, the early stages of the digital decimation filter can, for example, reduce an incoming data rate having an integer and fractional oversampling rate change factor K to a lower rate change factor $K_1$ which is solely an integer factor. In this manner, the oversampling ratio K of the delta-sigma modulator need not be constrained to an integer number. Instead, the digital data stream output from the delta-sigma modulator can comprise Kfs where K is either an integer or an integer number combined with a fractional number. The digital decimation filter and, particularly, the front-end stages of the digital decimation filter accommodate an integer and fractional oversampling ratio K. In this fashion, the back-end stages of the digital decimation filter (which are generally more complex than the front-end stages) can be more easily implemented by not having to accommodate an oversampling ratio $K_1$ having a fractional component.

The front-end stages of the multi-staged digital decimation filter preferably include less complex comb and cosine filters employed either as decimation or as interpolation filters. The first stage of the front-end stages preferably includes a comb decimation filter embodied as a differentiator and an integrator. The comb filter avoids using multipliers and, accordingly, transfer function of the comb filter can be achieved solely with adders and delay elements.

Subsequent to the first stage is a second stage which can be implemented either as a comb interpolation filter or as a cosine interpolation filter. The comb filter (i.e., $1-z^{-A}/1-z^{-1}$ term) can be reduced to $1+z^{-1}$ by virtue of A being equal to two, then the comb interpolation filter reduces to a cosine interpolation filter. Yet further, if A=2 for the second stage filter, and the decimation rate change of the third stage is equal to 2, then the second and third stages can be combined to form a cosine filter having a term of $1+z^{-1}$, implemented in two orders.

Used henceforth are basic building blocks called "terms". A term typically represents an operation embodied as a hardware element or a software instruction. A suitable operation provided in hardware provides one add and one delay element connected together in feedforward or feedback arrangement. If connected in feedforward with a negative add at the sum terminal, the term is said to represent a differentiator. If connected in feedback with a positive add at the sum terminal, the term represents an integrator. Yet further, if connected in feedforward with a positive add at the sum terminal, the term is said to represent a cosine transfer function. Of course, integrators, differentiators, and cosine transfer terms may be separated by downsampling or upsampling rate change switches in order to effectuate sample rate conversion among the various stages of the front-end portion.

In essence, the front-end portion of the digital decimation filter can be implemented either as three stages with associated sample rate conversions or as two stages, wherein the latter stages were combined into a single stage with sample rate conversion pre- and post that combined stage. The initial stages significantly reduce the data rate arriving from the quantizer of the delta-sigma modulator and therefore can present a reduced data rate to the more complex FIR and/or IIR filters within the back-end portion. The front-end stages beneficially provide an integer oversampling ratio $K_1$ even though the oversampling ratio K arriving from the quantizer may include a non-integer (i.e., fractional) component.

Broadly speaking, an A/D converter is provided. The A/D converter is adapted to produce a two-level digital output signal during use. A first stage of a decimation filter is coupled to receive the digital signal directly from the converter, and produce a first stage digital output signal having a data rate reduced by a factor M1 from that of the digital signal. A second stage of an interpolation filter is coupled to receive the first stage digital output signal and produce a second stage digital output signal having a data rate increased by a factor M2 from that of the first stage digital output signal. Preferably, 2M1 is greater than M2, and the ratio of M1/M2 is limited programmable between an integer number and an integer number containing a fraction. Switching between integer and fractional ratios can beneficially occur on-the-fly.

Preferably, the second stage comprises a comb filter having a $1-z^{-A}$ term divided by a $1-z^{-1}$. If A equals two, then the comb filter can be reduced to a cosine filter having a transfer term of $1+z^{-1}$.

A third stage of a decimation filter may be coupled to receive the second stage digital output signal. The third stage includes a data rate reduction factor M3 so that data rate is reduced from the second stage digital output signal. Preferably, M1 is greater than M3, and the product of M1*M3 divided by M2 is programmable between an integer number and an integer number containing a fraction. The second and third stage may be combined to form a single stage, second order cosine filter having a $1+z^{-1}$ term if A equals two and M3 equals two.

A multi-staged digital decimation filter is also provided. The digital decimation filter includes a first stage filter coupled to receive a digital input signal and produce a first stage digital output signal having a data rate reduced by a factor M1 from that of the digital input signal. A second stage filter may also be provided to receive the first stage digital output signal and produce a second stage digital output signal having a data rate increased by a factor M2 from that of the first stage digital output signal. The ratio of M1/M2 is programmable between an integer number and a fraction.

A method may also be provided for decimation filtering a digital signal. The method may include first programming a decimation rate of a first stage filter and an interpolation rate of a second stage filter to accomplish fractional data rate reduction of the digital signal. Thereafter, a second programming of the decimation of the first stage filter and the interpolation rate of the second stage filter may be accomplished to achieve integer data rate reduction of the digital signal. The decimation and interpolation rates can therefore be selectable between either fractional data rate reduction or integer data reduction depending on the oversampling ratio K and/or the baseband sampling frequency fs.

BRIEF DESCRIPTION OF THE DRAWINGS

Other objects and advantages of the invention will become apparent upon reading the following detailed description and upon reference to the accompanying drawings in which.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
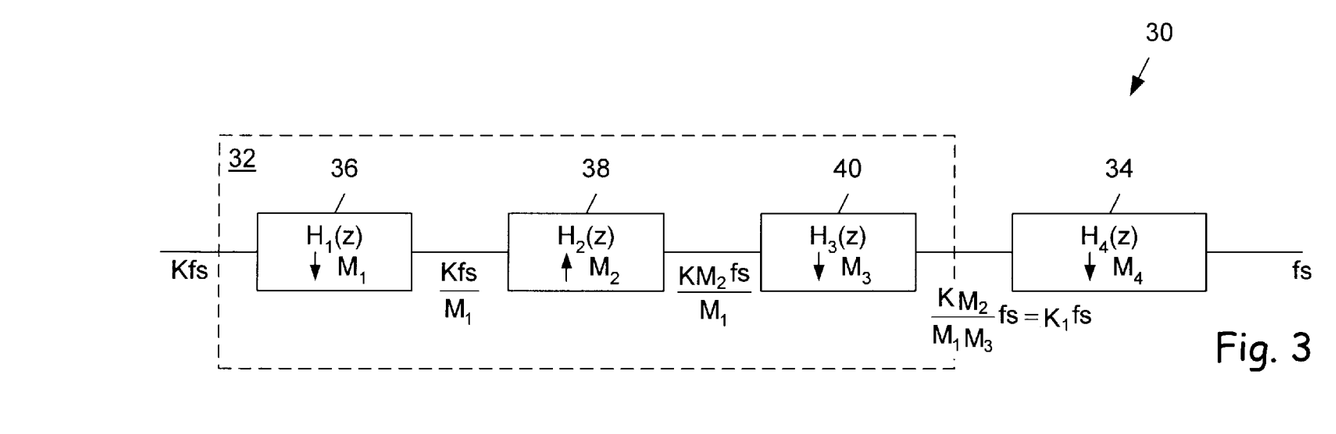
FIG. 3 is a symbolic representation of a multi-stage implementation of the digital decimation filter.

Turning now to FIG. 3, a multi-rate digital filter 30 is shown. Digital filter 30 revives a digital signal transmitted at a relatively high oversampling quantizer such as those found within a delta-sigma modulator. The oversampling rate Kfs represents the data rate of 1s and 0s produced by, e.g., the quantizer. Digital filter 30 is therefore shown as a digital decimation filter since it reduces the data rate from Kfs to fs. Filter 30 may have two portions: a front-end portion 32 and a back-end portion 34. The front-end portion 32 preferably contains less complex filter stages than the stages within back-end portion 34.

Portion 32, like portion 34, employs not only a filtering component, but also a mechanism for changing the data transfer rate within that portion. According to one embodiment, portion 32 includes three separate filters and three associated rate change switches, the cumulative effect of which is to reduce the incoming data rate from a relatively large K to a smaller $K_1$. Thus, portion 32 reduces the rate change factor K to a smaller rate change factor $K_1$ which can effectively reduce the speed at which add, delay and multiply operations are performed within back-end portion 34. Portion 34 being more complex and possibly containing multiplier operations gains substantial benefit by "preconditioning" the incoming data rate to a lower value.

In accordance with the first embodiment, front-end portion 32 includes three filter stages 36, 38 and 40. Stage 36 is shown having a transfer function $H_1(z)$, and includes a decimation rate change switch of rate change factor M1. Second stage 38 is shown having a transfer function $H_2(z)$ with an interpolation rate change factor M2. Third stage 40 is shown having a transfer function $H_3(z)$ with a decimation rate change factor M3. Back-end portion 34 may include many stages, each of which may include a filtering element. For example, portion 34 may include comb filters with decimation rate change switches linked also to an FIR filter having an associated a decimation rate change switch. The end result is to further decrease the data rate from $K_1$fs, wherein fs is the Nyquist sampling frequency at which, for example, the analog signal is initially sampled. The Nyquist rate is twice the baseband frequency.

The decimation filter stage 36 of FIG. 3 is preferably a comb decimation filter possibly implemented as a differentiator and an integrator separated by a decimation rate change switch. The factor A in the term $1-z^{-A}$ helps determine the number of zeros in the frequency range between zero and fs/2. However, the number of orders N determines the slope/attenuation characteristics of the filter. If this is the case, each zero point lies in the center of each of the alias or image bands. The order N, defined herein below of a comb filter specifies the number of 0s at each zero point.

By using comb filters, higher frequencies receive greater attenuation than lower frequencies. The roll-off benefits are particularly favorable when a comb filter is used as a low pass filter to remove oversampling quantizer noise. Primarily for this reason, a comb filter is preferred as the first filter stage 36 since digital filter 30 may be used in connection with an oversampling delta-sigma modulator. The lower frequency range is where the comb filter attenuation is lessened.

If the design specification mandates a minimum stop band attenuation of a certain dB value for a given K rate change factor, then the comb filter may require N number of orders to meet that design specification. If the number of orders N is not increased commensurate with a minimum attenuation increase, then the resulting comb structure cannot remove aliasing or imaging errors according to specification. As defined herein, an "order" refers to the amount of product terms needed to employ the filter. An Nth order integrator separated by a rate change switch from the Nth order differentiator requires 2N terms (i.e., N terms for the integrator and N terms for the differentiator). A single Nth order integrator so separated from the Nth order differentiator is herein referred to as a single stage, N order comb filter.

Figure 4:
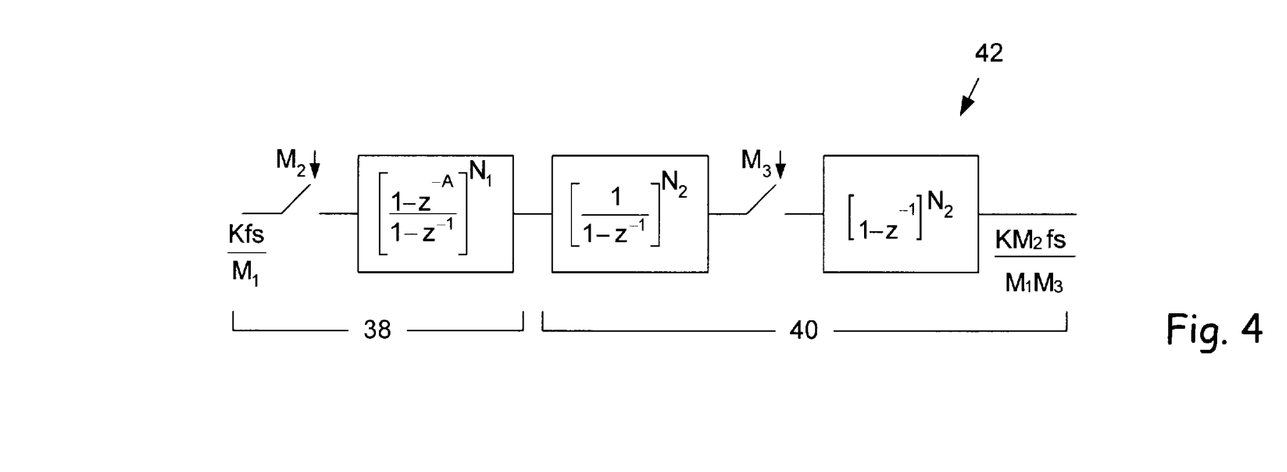
FIG. 4 illustrates generalized transfer functions and rate change switches for two stages within the decimation filter of FIG. 3.

FIG. 4 illustrates symbolic representations of stages 38 and 40, having associated rate change switches separated from corresponding transfer functions. Stage 38 can be achieved by a comb interpolation filter, which can be thought of as having a differentiator term $1-z^{-A}$ and an integrator term $1/1-z^{-1}$. The differentiator, as well as the integrator, can each be implemented in $N_1$ orders.

Similar to the comb filter which may be used in stage 36, comb filter 38 integrator and differentiator terms can be rather significant (i.e., lengthy term count and word length $W_L$) of bits forwarded to the integrator. Preferably, however, the operations needed to achieve the integrator and differentiator functions of the comb filter simply involve an adder and a delay element and not a multiplication operation. This can be achieved either in hardware or through a micro-code sequencer. Usually A equals M3, for the purpose for removing noise in the frequency band that will be aliased into the passband when reducing the data rate by a factor of M3 in stage 40.

Stage 40, similar to stage 38, can also be implemented as a comb filter. However, instead of being a comb interpolation filter, stage 40 is shown as a comb decimation filter with rate change switch M3. The differentiator term is brought across the rate change switch M3 using the well known commutative rule. This results in an integrator term $1/1-z^{-1}$ occurring prior to decimation M3, and the differentiator term $1-z^{-1}$ occurring after decimation M3. The commutative rule could also be applied to the comb filter within second stage 38, if desired. Details of the commutative rule is set forth in Chu, et al "Multirate Filter Designs Using Comb Filters" (IEEE Trans. Circuits and Systems) pp. 405–416 (herein incorporated by reference).

Figure 5:
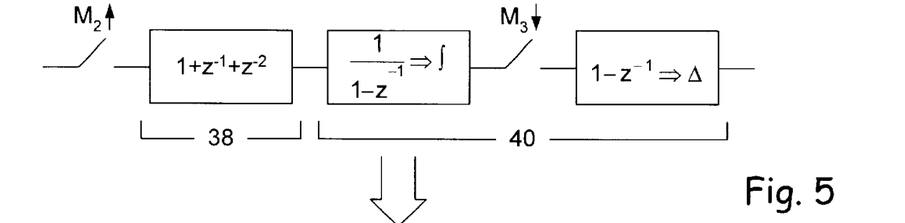
FIG. 5 illustrates simplified transfer functions for two stages of the decimation filter if the generalized exponential term A is an integer number greater than two, according to one embodiment.

If the factor A=3 and orders $N_1=N_2=1$, then the symbolic representation 42 shown in FIG. 4 is reduced to the embodiment illustrated in FIG. 5, as reference numeral 50. Primarily, the transfer function of comb filter 38 reduces to that shown in FIG. 5 if A equals three. However, if A equals an integer greater than two, then the terms will continue as $1+z^{-1}+z^{-2}+\ldots$, etc. Since orders $N_1=N_2=1$, then a single order integrator and a single order differentiator are realized, as shown. If A is less than or equal to M2, then comb filter 38 is simply a latch which holds the input data A times.

Figure 6:
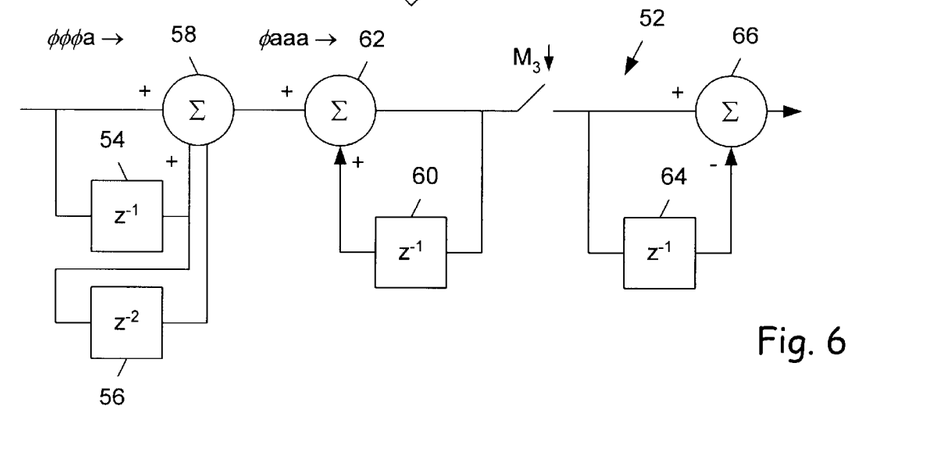
FIG. 6 illustrates structural components which may be used to carry out the discrete time transfer functions shown in FIG. 5.

FIG. 6 illustrates hardware components 52 used to produce the transfer functions shown in FIG. 5. Specifically, stage 38 is implemented with a single delay component 54 coupled in serial with another delay component 56 in feedforward arrangement with sum node 58. The delay elements 54 and 56 thusly coupled essentially delay the sampled incoming digital data and accumulate the delayed sampled data three digital positions as shown. However, if the factor A is greater than 3, then the amount of delay will be commensurate with that factor. In the example illustrated in FIG. 6, the interpolation rate change M2 is equal to four; however, it is understood that interpolation rate change can be greater than or less than four if desired.

FIG. 6 also illustrates the components needed to carry out integration and differentiation of third stage 40. Integration is achieved by feedback from a delay element 60 into sum node 62. Differentiation, on the other hand, uses feedforward of results from a delay element 64 into a subtraction terminal of sum node 66. FIG. 6 illustrates single order integration and single order differentiation; however, it is understood that multiple order differentiators and integrators can form third stage filter 40 if $N_2$ is greater than one.

Figure 7:
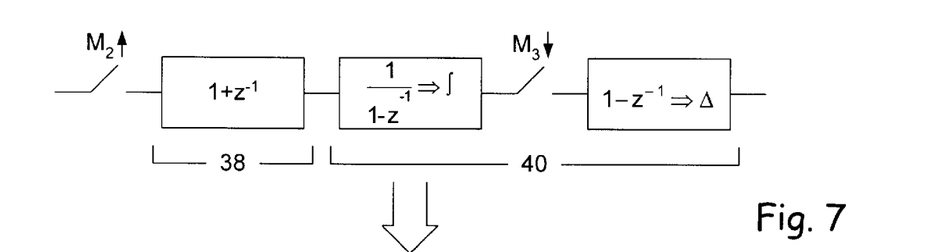
FIG. 7 illustrates simplified transfer functions for two stages of the decimation filter if the generalized exponential term A is an integer number equal to two, according to another embodiment.

FIG. 7 illustrates another embodiment, wherein exponential factor A shown in FIG. 4 is equal to two. In this instance, second stage interpolation filter 38 reduces to a cosine filter having a transfer term $1+z^{-1}$. The third stage 40 remains the same as an integrator separated from a differentiator by a rate change switch of factor M3. FIG. 7 illustrates a single order integrator and differentiator. However, more than one order may be needed depending on the design specification. Of benefit, is the rather simplistic form at which the second stage filter 38 can be implemented.

Figure 8:
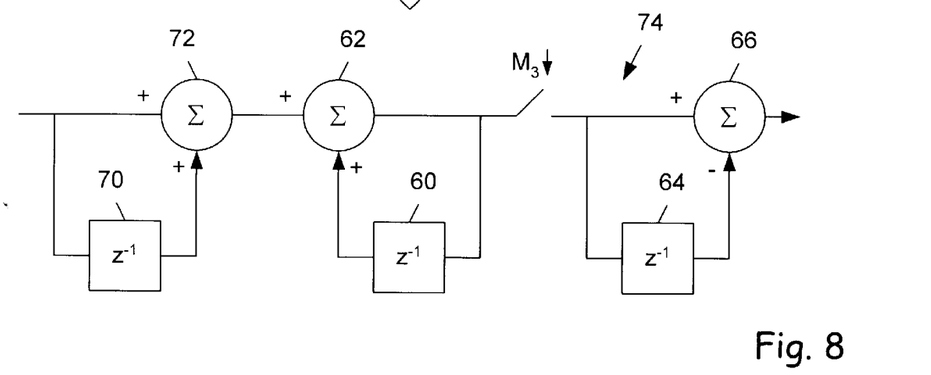
FIG. 8 illustrates structural components which may be used to carry out the discrete time transfer functions shown in FIG. 7.

FIG. 8 illustrates the cosine filter as simply a single delay element 70 coupled in feedforward arrangement to the sum terminal of sum node 72. The remaining components which form third stage filter 40 bear the same reference numerals as those set forth in FIG. 6. Thus, the overall hardware or software needed to implement the composite component structure 74 is reduced from the component structure 52 shown in FIG. 6.

Figure 9:
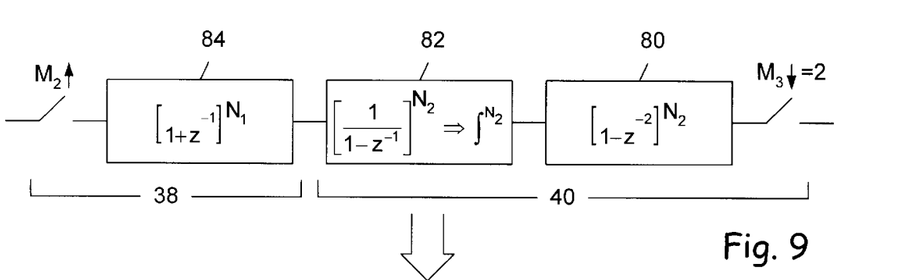
FIG. 9 illustrates simplified transfer functions for two stages of the decimation filter if exponential term A and rate change M3 are both equal to two, according to another embodiment.
Figure 10:
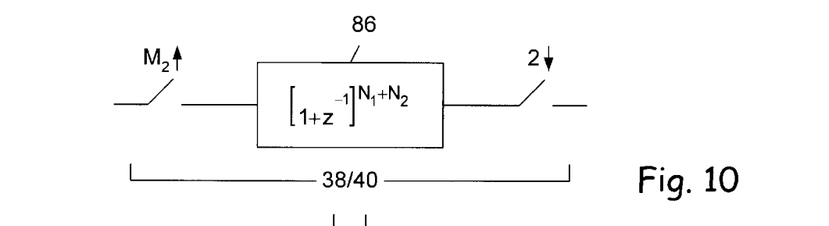
FIG. 10 illustrates one stage derived from a reduction of two stages set forth in FIG. 9.

According to yet a further embodiment, the componentry or micro-code instructions can be further reduced as set forth in FIG. 9. Specifically, if decimation rate change M3 is equal to two, then the differentiator term which was previously on the decimated side of the decimator switch can be moved to the higher data rate side by increasing the exponential factor from $1-z^{-1}$ to $1-z^{-2}$, as shown by the resulting transfer function 80. Transfer function 80 third stage filter 40 can be combined with the preexisting transfer function 82 of the $N_2$ order integrator. Furthermore, the transfer function 84 of the second stage filter 38 can also be combined with terms 80 and 82 to produce that which is shown in FIG. 10. The result is a calculation free step.

Figure 11:
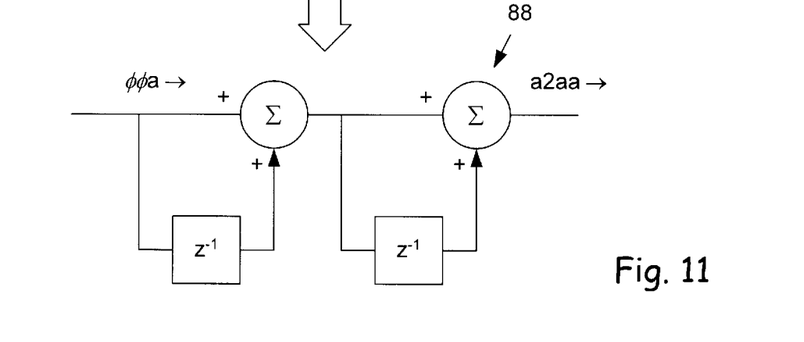
FIG. 11 illustrates structural components which may be used to carry out the discrete time transfer functions shown in FIG. 10.

The combination of terms 80, 82 and 84 reduce simply to a multiple order ($N_1+N_2$ order) cosine filter having a transfer function shown by reference number 86. Transfer function 86 of FIG. 10 can be realized in the most simple form as a second order cosine filter ($N_1=N_2=1$) and realized with the composite componentry 88 shown in FIG. 11. If, for example, M2=3 and given that $N_1+N_2=2$ and M3=2, then an incoming data stream of a, followed by 0, will be dispatched from components 88 as a, followed by 2a, then followed by a. After decimation by 2, the data stream produced from the combined second and third stages 38/40 is sent simply as a single 2a sample. The following illustrates data flow of the composite component 52 shown in FIG. 6:

TABLE I

| | <------------Flow | | |
|---|---|---|---|
| post quantizer data stream: | a | b | c |
| post M2 interpolation switch: | a000 | b000 | c000 |
| post filter 38: | aaa0 | bbb0 | ccc0 |

The data flow information shown in Table I assumes rate change factor M2=4 and the second stage transfer function is equal to $1+z^{-1}+z^{-2}$ (where A=3).

The data flow through the composite components shown as reference numeral 88 in FIG. 10 is illustrated as follows:

TABLE II

|  | <------------ Flow | | |
| --- | --- | --- | --- |
| post quantizer data stream: | a | b | c |
| post M2 interpolation switch: | a00 | b00 | c00 |
| post filter 38/40: | a2aa | b2bb | c2cc |

Data flow through components 88, attributed to the third embodiment, assumes $N_1+N_2=2$, $A=2$ and $M3=2$. Instead of M2 being equal to 4, as shown in Table I, Table II indicates $M2=3$. Of course, the factors M2, M3, A, $N_1$ and $N_2$ can vary from that of the examples shown, depending on the particular design specification.

The combination of decimation, followed by interpolation, and then followed again by decimation can produce a cumulative fractional or integer decimation. The benefit in selectively changing the overall decimation rate of portion front-end 32 shown in FIG. 3 is particularly useful depending on the data rate produced from the quantizer of the delta-sigma modulator, for example. If $M3=2$, and $A=2$, then the combination of decimation, followed by interpolation of 3, and then followed by decimation by 2 can accommodate an integer data rate change factor K, or an integer in combination with a fraction data rate change factor K. For example, if $K=1792/3$, then the first stage filter 36 decimation factor M1 is chosen as 56, whereby the combination of 56 decimation, followed by interpolation by 3 and decimation by 2 will reduce the incoming data rate of 1792 fs/3 to 16 fs. However, if the incoming data rate is 640 fs, then the first decimation is re-programmed to 60 rather than 56, and the combination of 60 decimation, 3 interpolation, and 2 decimation will produce 16 fs. In each instance, front-end portion 32 (shown in FIG. 3) produces a data rate change factor $K_1$ of 16 from a variable data rate change factor K, regardless of whether K is an integer number or a combination integer and fractional number.

Front-end portion 32 (shown in FIG. 3) can therefore decimate the incoming data stream from an integer/fractional data rate change factor K to possibly a fixed integer data rate change factor $K_1$ for both modem (data) or audio applications. The following Table III indicates application to varying data rate change factors K and varying baseband (fs) frequencies:

TABLE III

| K | fs |
| --- | --- |
| Modem: | |
| 512 | 12.0 KHz |
| 1792/3 | 10.287 KHz |
| 640 | 9.6 KHz |
| 2048/3 | 9.0 KHz |
| 2240/3 | 8.229 KHz |
| 768 | 8.0 KHz |
| 2560/3 | 7.2 KHz |
| Audio: | |
| 128 | 48.0 KHz |
| 418/3 | 44.1 KHz |
| 836/3 | 22.05 KHz |

It would be appreciated by those skilled in the art having the benefit of this disclosure that the A/D converter, the decimation filter, or the method thereof is believed to be capable of applications in which noise can be reduced within a specific frequency range. Furthermore, it is also to be understood that the invention shown and described is to be taken as presently preferred embodiments. Various modifications and changes may be made to the design structure to optimize the term count and the overall filter composition as would be obvious to a person skilled in the art having the benefit of this disclosure. The specification and drawings are therefore to be regarded in an illustrative rather than a restrictive sense.

What is claimed is:

1. An analog-to-digital converter, comprising:

a digital signal;

a first stage of a decimation filter coupled to receive the digital signal and produce a first stage digital output signal having a data rate reduced by a factor M1 from that of the digital signal; and a second stage of an interpolation filter coupled to receive the first stage digital output signal and produce a second stage digital output signal having a data rate increased by a factor M2 from that of the first stage digital output signal, wherein 2M1 is greater than M2, and wherein the ratio of M1 divided by M2 is programmable between an integer number and an integer number containing a fraction.

2. The analog-to-digital converter as recited in claim 1, wherein said converter comprises a delta-sigma modulator.

3. The analog-to-digital converter as recited in claim 1, wherein said converter comprises a quantizer which samples at least 128 times for each cycle of an analog signal forwarded to the converter.

4. The analog-to-digital converter as recited in claim 1, wherein said second stage comprises a comb filter comprising a $1-z^{-A}$ term divided by a $1-z^{-1}$ term.

5. The analog-to-digital converter as recited in claim 4, wherein said second stage comprises a cosine filter having a transfer term of $1+z^{-1}$ if A equals two.

6. The analog-to-digital converter as recited in claim 1, further comprising a third stage of a decimation filter coupled to receive the second stage digital output signal having a data rate decreased by a factor M3 from that of the second stage digital output signal, wherein M1 is greater than M3, and wherein the product of M1 times M3 divided by M2 is programmable between an integer number and an integer number containing a fraction.

7. The analog-to-digital converter as recited in claim 1, wherein said second stage comprises a comb filter having a $1-z^{-A}$ term divided by a $1-z^{-1}$ term, and wherein the second and third stages combine to form a single stage, multiple order cosine filter having a transfer term consisting of $1+z^{-1}$ if A equals 2 and M3 equals 2.

8. A multi-stage digital decimation filter, comprising:

a first stage filter coupled to receive a digital input signal and produce a first stage digital output signal having a data rate reduced by a factor M1 from that of the digital input signal; and a second stage filter coupled to receive the first stage digital output signal and produce a second stage digital output signal having a data rate increased by a factor M2 from that of the first stage digital output signal, wherein the ratio of M1 divided by M2 is programmable between an integer number and an integer number containing a fraction.

9. The multi-stage digital decimation filter as recited in claim 8, wherein said digital input signal is dispatched from a quantizer within a delta-sigma modulator.

10. The multi-stage digital decimation filter as recited in claim 9, wherein said quantizer samples at least 128 times for each cycle of an analog signal forwarded to the delta-sigma modulator.

11. The multi-stage digital decimation filter as recited in claim 8, wherein the first stage filter is a comb filter.

12. The multi-stage digital decimation filter as recited in claim 8, wherein said second stage filter is a comb filter having a $1-z^{-A}$ term divided by a $1-z^{-1}$ term.

13. The multi-stage digital decimation filter as recited in claim 12, wherein said second stage is a cosine filter having a transfer term of $1+z^{-1}$ if A equals two.

14. The multi-stage digital decimation filter as recited in claim 8, further comprising a third stage filter coupled to receive the second stage digital output signal having a data rate decreased by a factor M3 from that of the second stage digital output signal, wherein M1 is greater than M3, and wherein the product of M1 times M3 divided by M2 is programmable between an integer number and an integer number containing a fraction.

15. The multi-stage digital decimation filter as recited in claim 8, wherein said second stage filter is a comb filter having a $1-z^{-A}$ term divided by a $1-z^{-1}$ term, and wherein the second and third stage filters combine to form a single stage, multiple order cosine filter having a transfer function consisting of $1+z^{-1}$ if A equals 2 and M3 equals 2.

16. A method for performing decimation filtering of a digital signal, comprising:

first programming a decimation rate of a first stage filter and an interpolation rate of a second stage filter to accomplish fractional data rate reduction of the digital signal; and second programming the decimation rate of the first stage filter and the interpolation rate of the second stage filter to accomplish integer data rate reduction of the digital signal.

17. The method as recited in claim 16, wherein said first programming occurs if a data rate of the digital signal is multiples of an integer and a fraction of a data rate of a digital signal produced from the second stage filter.

18. The method as recited in claim 16, wherein said second programming occurs if a date rate of the digital signal is an integer multiple of a date rate of a digital signal produced from the second stage filter.

* * * * *